(12) United States Patent
Ohno

(10) Patent No.: US 7,924,897 B2
(45) Date of Patent: Apr. 12, 2011

(54) SEMICONDUCTOR LASER DEVICE

(75) Inventor: Hiroshi Ohno, Hyogo (JP)

(73) Assignee: Panasonic Corporation, Osaka (JP)

( * ) Notice: Subject to any disclaimer, the term of this patent is extended or adjusted under 35 U.S.C. 154(b) by 803 days.

(21) Appl. No.: 11/889,818

(22) Filed: Aug. 16, 2007

(65) Prior Publication Data

US 2008/0056319 A1 Mar. 6, 2008

(30) Foreign Application Priority Data

Sep. 1, 2006 (JP) ................................. 2006-238086

(51) Int. Cl.
*H01S 5/00* (2006.01)
(52) U.S. Cl. .................. 372/49.01; 372/43.01; 372/50.1
(58) Field of Classification Search ............... 372/43.01, 372/49.01, 50.1
See application file for complete search history.

(56) References Cited

U.S. PATENT DOCUMENTS

| | | | | |
|---|---|---|---|---|
| 5,753,966 A * | 5/1998 | Morita et al. | ................. | 257/627 |
| 6,278,173 B1 * | 8/2001 | Kobayashi et al. | ............ | 257/627 |
| 6,455,342 B2 * | 9/2002 | Kobayashi et al. | ............ | 438/33 |
| 6,482,666 B1 * | 11/2002 | Kobayashi et al. | ............ | 438/33 |
| 6,737,678 B2 * | 5/2004 | Kawakami et al. | ............ | 257/79 |
| 7,041,523 B2 * | 5/2006 | Kawakami et al. | ............ | 438/33 |
| 7,397,834 B2 * | 7/2008 | Kozaki et al. | ............ | 372/46.012 |
| 2001/0013608 A1 * | 8/2001 | Kobayashi et al. | ............ | 257/88 |
| 2003/0030053 A1 * | 2/2003 | Kawakami et al. | ............ | 257/72 |
| 2009/0262771 A1 * | 10/2009 | Inoue et al. | ................. | 372/45.01 |

FOREIGN PATENT DOCUMENTS

| | | |
|---|---|---|
| JP | 56-071989 | 6/1981 |
| JP | 59-14914 | 4/1984 |
| JP | 11-251265 | 9/1999 |

* cited by examiner

*Primary Examiner* — Minsun Harvey
*Assistant Examiner* — Delma R Forde
(74) *Attorney, Agent, or Firm* — McDermott Will & Emery LLP

(57) ABSTRACT

A semiconductor laser device includes a chip obtained from a substrate and a semiconductor multi-layer formed on the substrate. The semiconductor multi-layer is formed from a plurality of semiconductor layers of a semiconductor material having a hexagonal structure, and includes a stripe-shaped wave guide portion. The chip includes two chip end facets that extend in a direction crossing an extending direction of the wave guide portion. Each of regions on both sides of the wave guide portion in at least one of the chip end facets has a notch portion formed by notching a part of the chip, and the notch portion exposes a first wall surface connecting to the chip end facet and a second wall surface connecting to the chip side facet. An angle between an extending direction of the first wall surface in at least one of the two notch portions and an extending direction of the cleavage facet is in a range of about 10 degrees to about 40 degrees.

11 Claims, 14 Drawing Sheets

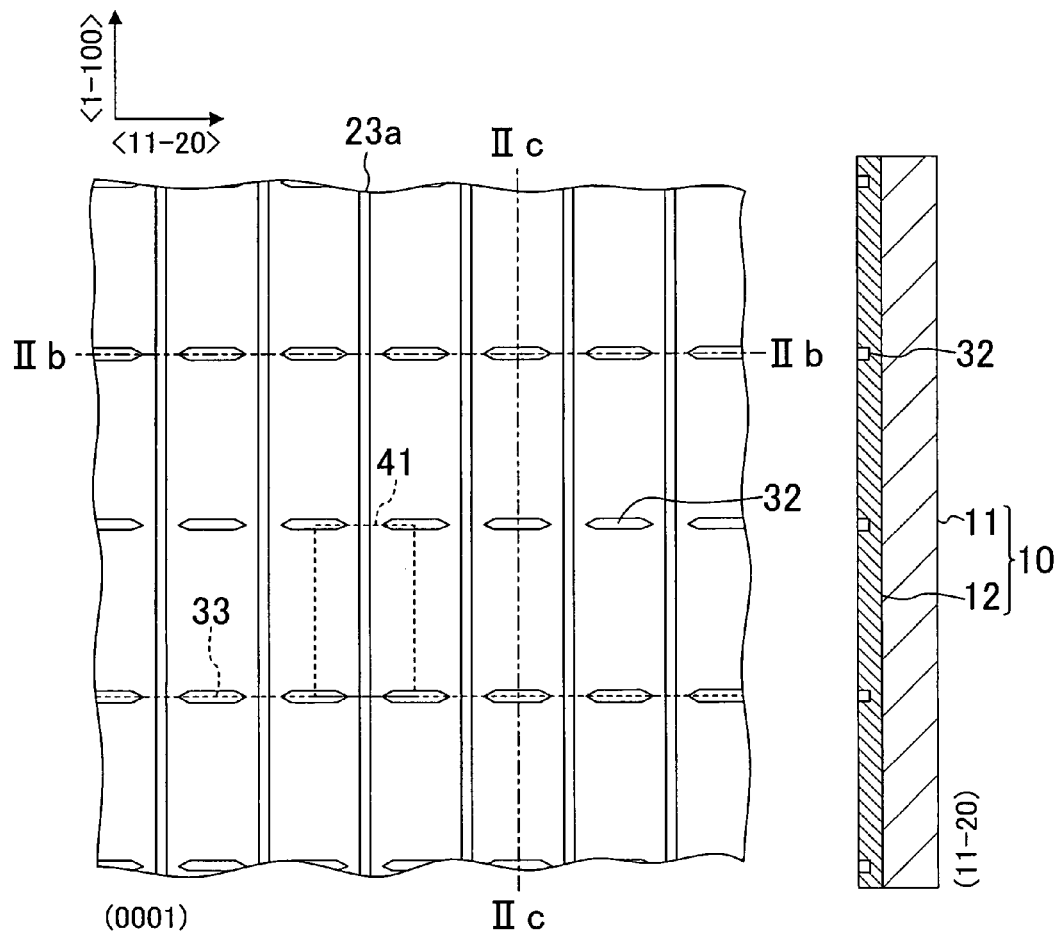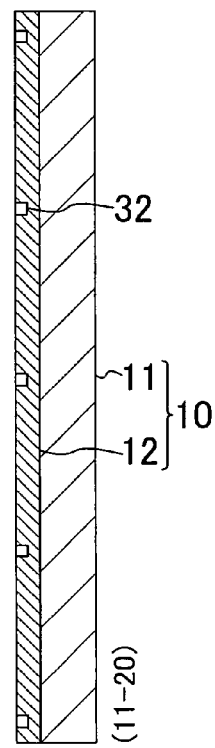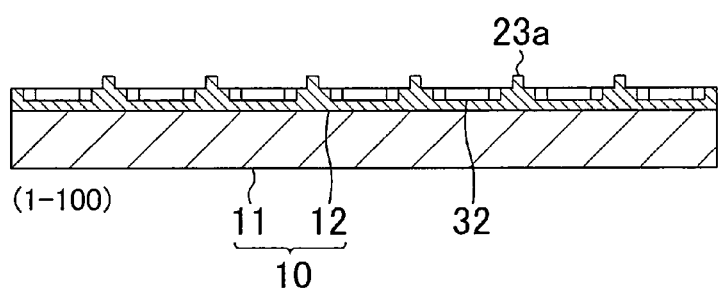

SEMICONDUCTOR LASER DEVICE

CROSS REFERENCE TO RELATED APPLICATION

This application claims priority under 35 U.S.C. §119 on Patent Application No. 2006-238086 filed in Japan on Sep. 1, 2006, the entire contents of which are hereby incorporated by reference.

BACKGROUND OF THE INVENTION

1. Field of the Invention

The invention relates to a semiconductor laser device and a manufacturing method thereof. More particularly, the invention relates to a semiconductor laser device having a chip end facet formed by cleavage, and a manufacturing method thereof.

2. Background Art

III-V compound semiconductor laser devices such as aluminum gallium arsenic (AlGaAs)-based infrared laser devices or indium gallium phosphorus (InGaP)-based red laser devices have been widely used as elements of communication devices or as reading and writing elements of CDs (Compact Discs) or DVDs (Digital Versatile Discs). Recently, blue or ultraviolet semiconductor laser devices having a shorter wavelength have been implemented by using a nitride semiconductor represented by general formula $Al_xGa_yIn_{(1-x-y)}N$ (where $0 \leq x \leq 1$, $0 \leq y \leq 1$, and $0 \leq x+y \leq 1$). Semiconductor laser devices using a nitride semiconductor have been gradually used in practical applications as reading and writing light sources of next generation high-density optical discs such as Blu-ray Disc. Blue laser devices of several tens of milliwatts are currently available on the market. However, higher output has been demanded for an improved recording speed, and 100 mW-level laser devices are coming onto the market.

In a semiconductor laser device, a resonator end facet is generally formed by cleavage. In infrared and red semiconductor laser devices that are formed from a semiconductor material having a Zinc-blende structure, such as AlGaAs-based and GaInP-based semiconductor materials, the semiconductor has a cleavage facet at every 90 degrees and therefore has very high cleavage accuracy. However, since a crystal structure of a nitride semiconductor such as GaN is a hexagonal wurtzite structure, the semiconductor has a (1-100) face as a cleavage facet and an equivalent cleavage facet that is 60 degrees away from the (1-100) face. Therefore, upon cleavage, cracks are formed also in the direction of 60 degrees from the cleavage direction, and it is difficult to form a structurally stable cleavage facet.

In order to solve this problem, Japanese Patent Laid-Open Publication No. 2003-17791 discloses a method for forming a scribe mark like a dashed line on a nitride semiconductor layer by using a diamond needle or the like, and conducting cleavage by breaking by using the scribe mark as a cleavage guide. However, when cleavage guide grooves are formed by scribing or dicing, a nitride semiconductor layer is scratched. Therefore, a lot of defects such as end facet cracks, unevenness, fractures, and chips are generated in the grooves themselves, causing a cleavage facet to be displaced. Moreover, since grooves formed by scribing do not necessarily have a uniform shape, it is difficult to accurately control the cleavage position.

Japanese Patent No. 59-14914 and Japanese Patent Laid-Open Publication No. 11-251265 disclose a method for forming cleavage guide grooves by etching. When cleavage guide grooves are formed by etching, the position and shape of the grooves can be accurately controlled.

However, the inventors found that, in the case of a nitride semiconductor, an intended cleavage facet still cannot be obtained even when the cleavage guide grooves are formed. More specifically, as described above, a nitride semiconductor essentially has a poor cleavage property, and has an equivalent cleavage facet in the direction of 60 degrees from a cleavage facet. Therefore, even when cleavage guide grooves are formed, cleavage does not occur along the grooves, or cleavage starts from a portion other than the end of the groove. Accordingly, an intended cleavage facet cannot be obtained.

SUMMARY OF THE INVENTION

The invention is made in order to solve the conventional problems, and it is an object of the invention to implement a semiconductor laser device using a semiconductor material of a hexagonal system such as a nitride semiconductor and having a structurally stable cleavage facet, and a manufacturing method of such a semiconductor laser device.

In order to achieve the above object, in a semiconductor laser device of the invention, a cleavage guide has an end portion having a V shape when viewed two dimensionally.

More specifically, a semiconductor laser device according to one aspect of the invention includes a chip obtained from a substrate and a semiconductor multi-layer formed on the substrate. The semiconductor multi-layer is formed from a plurality of semiconductor layers of a semiconductor material having a hexagonal structure, and includes a stripe-shaped wave guide portion. The chip includes two chip end facets that extend in a direction crossing an extending direction of the wave guide portion, and two chip side facets that extend in parallel with the extending direction of the wave guide portion. A region including the wave guide portion in each chip end facet is a cleavage facet resulting from cleavage of the semiconductor multi-layer. Each of regions on both sides of the wave guide portion in at least one of the chip end facets has a notch portion formed by notching a part of the chip. The notch portion exposes a first wall surface connecting to the chip end facet and a second wall surface connecting to the chip side facet. An angle between an extending direction of the first wall surface in at least one of the two notch portions and an extending direction of the cleavage facet is in a range of about 10 degrees to about 40 degrees.

In the semiconductor laser device of the invention, the extending direction of the first wall that serves as a cleavage guide is significantly different from that of a crystal face that is equivalent to the cleavage facet. Accordingly, cleavage is less likely to proceed in a direction different from the extending direction of the cleavage facet, whereby an accurate cleavage facet can be formed. As a result, a semiconductor laser device having a structurally stable cleavage facet is implemented.

A method for manufacturing a semiconductor laser device according to another aspect of the invention includes the steps of: (a) forming a semiconductor wafer that has a plurality of stripe-shaped wave guide portions extending in one direction at intervals by first forming on a substrate a semiconductor multi-layer including an n-type clad layer, an active layer, and a p-type clad layer and then selectively etching the p-type clad layer; (b) selectively etching the semiconductor wafer having the plurality of wave guide portions to form a plurality of grooves arranged in a line in a region except for the wave guide portions in a direction crossing an extending direction of the wave guide portions; and (c) by using the plurality of grooves arranged in a line as a cleavage guide, forming a cleavage facet exposing the wave guide portions along the cleavage guide. Each groove has an end portion at at least one of its two ends located in a direction crossing an extending direction of the wave guide portions, and the end portion has a V shape when viewed two dimensionally. An angle between two sides surrounding the end portion is in a range of about 20 degrees to about 80 degrees, and an angle between an extending direction of at least one of the two sides surrounding the end portion and a direction in which the cleavage facet is formed is in a range of about 10 degrees to about 40 degrees.

In the method for manufacturing a semiconductor laser device according to the invention, the direction of the end portions of the grooves that serve as a cleavage guide is significantly different from the extending direction of a crystal face that is equivalent to the cleavage facet. Accordingly, cleavage is less likely to proceed in a direction other than the extending direction of the cleavage facet, whereby cleavage can be accurately conducted along a cleavage line connecting the end portions of the grooves. As a result, a semiconductor laser device can be manufactured with an excellent yield.

BRIEF DESCRIPTION OF THE DRAWINGS

FIGS. 1A, 1B, and 1C show a semiconductor laser device according to a first embodiment of the invention, wherein FIG. 1A is a perspective view, FIG. 1B is a plan view, and FIG. 1C is a cross-sectional view on the side of a chip end facet;

FIGS. 2A, 2B, and 2C show a semiconductor wafer for manufacturing a semiconductor laser device according to the first embodiment of the invention, wherein FIG. 2A is a plan view, FIG. 2B is a cross-sectional view taken along line IIb-IIb in FIG. 2A, and FIG. 2C is a cross-sectional view taken along line IIc-IIc in FIG. 2A;

FIGS. 3A and 3B show a cleavage facet of the semiconductor laser device of the first embodiment of the invention, wherein FIG. 3A is a plan view and FIG. 3B is a cross-sectional view;

FIGS. 9A and 9B show a cleavage facet in a modification of the semiconductor laser device of the first embodiment of the invention, wherein FIG. 9A is a plan view and FIG. 9B is a cross-sectional view.

FIGS. 10A and 10B show a cleavage facet in a modification of the semiconductor laser device of the first embodiment of the invention, wherein FIG. 10A is a plan view and FIG. 10B is a cross-sectional view;

FIGS. 11A and 11B show a cleavage facet in a modification of the semiconductor laser device of the first embodiment of the invention, wherein FIG. 11A is a plan view and FIG. 11B is a cross-sectional view;

FIGS. 13A and 13B show a cleavage facet of the semiconductor laser device according to the second embodiment of the invention, wherein FIG. 13A is a plan view and FIG. 13B is a cross-sectional view;

FIGS. 14A and 14B show a cleavage facet in a modification of the semiconductor laser device of the second embodiment of the invention, wherein FIG. 14A is a plan view and FIG. 14B is a cross-sectional view;

FIGS. 15A and 15B show a cleavage facet of a semiconductor laser device according to a third embodiment of the invention, wherein FIG. 15A is a plan view and FIG. 15B is a cross-sectional view; and FIGS. 16A and 16B show a cleavage facet of a semiconductor laser device according to a fourth embodiment of the invention, wherein FIG. 16A is a plan view and FIG. 16B is a cross-sectional view.

DETAILED DESCRIPTION OF THE PREFERRED EMBODIMENTS

First Embodiment

Figure 1A:
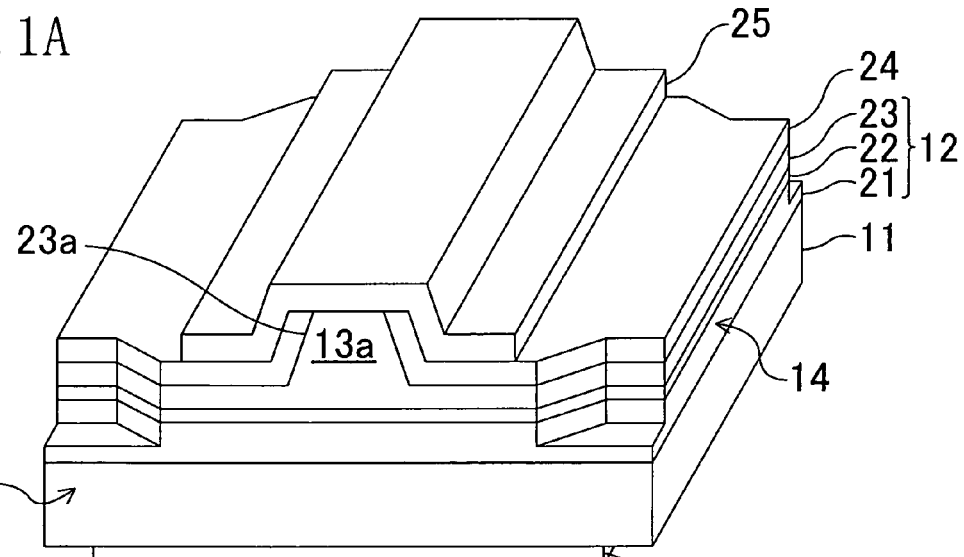
Figure 1B:
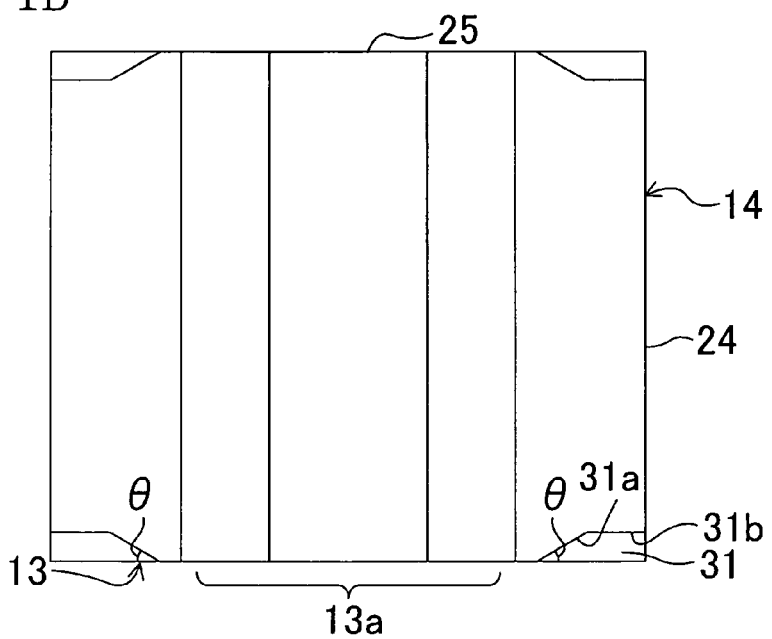
Figure 1C:
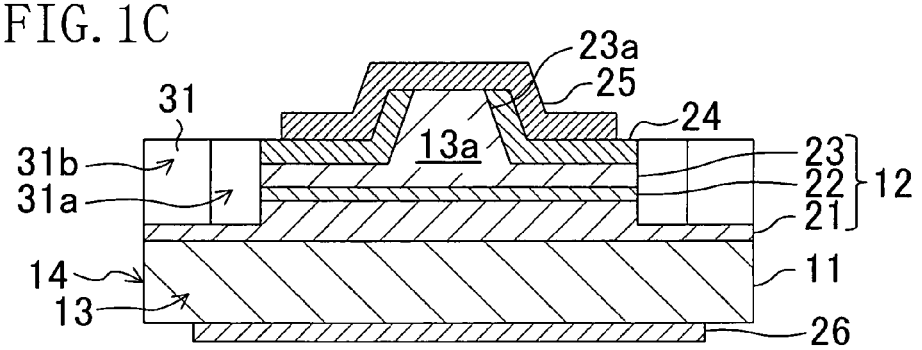

Hereinafter, a first embodiment of the invention will be described with reference to the drawings. FIGS. 1A through 1C show the structure of a semiconductor laser device according to the first embodiment. FIG. 1A shows the whole structure of the semiconductor laser device, FIG. 1B shows a planar structure of the semiconductor laser device, and FIG. 1C shows a cross-sectional structure on the side of a resonator end facet. The semiconductor laser device of this embodiment is a semiconductor chip obtained from a semiconductor wafer with multi-layer of nitride semiconductors.

As shown in FIGS. 1A through 1C, the semiconductor laser of this embodiment includes a substrate 11 formed from gallium nitride (GaN), and a nitride semiconductor multi-layer 12 formed on the substrate 11. The nitride semiconductor multi-layer 12 has an n-type semiconductor layer 21, an active layer 22, and a p-type semiconductor layer 23 which are sequentially epitaxial-grown on the substrate 11. The active layer 22 is formed from InGaN and has a multiple quantum well structure. A ridge stripe portion 23a is formed by selectively etching the p-type semiconductor layer 23.

A dielectric layer 24 for confining a current is formed on the p-type semiconductor layer 23 except on the top of the ridge stripe portion 23a. On the dielectric layer 24 is formed a p-side electrode 25 in contact with the top of the ridge stripe portion 23a. An n-side electrode 26 is formed on the rear surface of the substrate 11, that is, on the surface of the substrate 11 which is located on the opposite side of the nitride semiconductor multi-layer 12.

In the semiconductor laser device of this embodiment, a chip end facet 13 that extends approximately perpendicular to the extending direction of the ridge stripe portion 23a is formed by cleaving a semiconductor wafer. On the other hand, a chip side facet 14 that extends approximately parallel to the extending direction of the ridge stripe portion 23a is formed by dicing the semiconductor wafer. In this embodiment, a central part of the chip end facet 13 which includes the ridge stripe portion 23a is a smooth cleavage facet 13a, that is, an exposed (1-100) face of the nitride semiconductor multi-layer 12. The regions of the chip end facet 13 which are located on both sides of the cleavage facet 13a are formed by cleavage. However, these regions are not a perfect cleavage facet and have cleavage cracks, steps, and the like. Hereinafter, a "cleavage facet" does not refer to a facet that is formed by cleavage, but refers to a single crystal face exposed by cleavage.

When the semiconductor laser device of this embodiment is seen from the side of the chip end facet 13, a notch portion 31 is formed on both sides of the cleavage facet 13a. The notch portions 31 are formed by notching a part of the nitride semiconductor multi-layer 12. The planar shape of the notch portion 31 is approximately a right-angled trapezoid. The notch portion 31 exposes a first wall surface 31a connecting to the chip end facet 13 and a second wall surface 31b connecting to the chip side facet 14. An angle θ between the extending direction of the first wall surface 31a and the extending direction of the cleavage facet 13a is in the range of 10 degrees to 40 degrees. Details of the notch portion 31 will be given later.

FIGS. 2A through 2C show the structure of a pre-cleavage semiconductor wafer for forming a semiconductor laser device according to the first embodiment. FIG. 2A shows a planar structure of the semiconductor wafer, FIG. 2B shows a cross-sectional structure of the semiconductor wafer taken along line IIb-IIb, and FIG. 2C shows a cross-sectional structure of the semiconductor wafer taken along line IIc-IIc.

As shown in FIGS. 2A through 2C, a semiconductor wafer 10 of the first embodiment includes a substrate 11 and a nitride semiconductor multi-layer 12. The nitride semiconductor multi-layer 12 has a plurality of ridge stripe portions 23a formed on a (0001) face of the substrate 11. The plurality of ridge stripe portions 23a extend along a <1-100> orientation of the substrate 11 and are spaced apart from each other. The nitride semiconductor multi-layer 12 has a plurality of grooves 32 formed by etching the nitride semiconductor multi-layer 12 except the ridge stripe portions 23a. These grooves 32 are arranged in a line along a <11-20> orientation of the substrate 11. A plurality of cleavage guide grooves 33 are thus formed spaced apart from each other. Chips 41 of the semiconductor laser device are obtained as follows: the nitride semiconductor multi-layer 12 is first cleaved along each cleavage guide groove 33 to form a chip end facet 13. The semiconductor wafer is then divided into chips 41 by dicing in the direction parallel to the extending direction of the ridge stripe portions 23a. Approximately a quarter of each groove 32 remains in each chip 41, forming a notch portion 31.

Each groove 32 is formed by dry etching the nitride semiconductor multi-layer 12, and both ends of the groove 32 are V-shaped when viewed two dimensionally. When the grooves 32 are formed by dry etching, the position and shape of the grooves 32 can be accurately controlled, as opposed to the case where guide grooves are formed by scribing. Therefore, the grooves 32 can be shaped so as to function as a cleavage guide to the maximum extent possible, whereby cleavage yield can be significantly improved.

When viewed two dimensionally, each groove 32 has a flat hexagonal shape having sharp ends along the direction crossing the ridge stripe portions 23a. Therefore, cleavage is likely to occur along the line connecting the tips of the grooves 32, whereby a cleavage facet of an intended orientation can be easily formed.

Figure 3A:
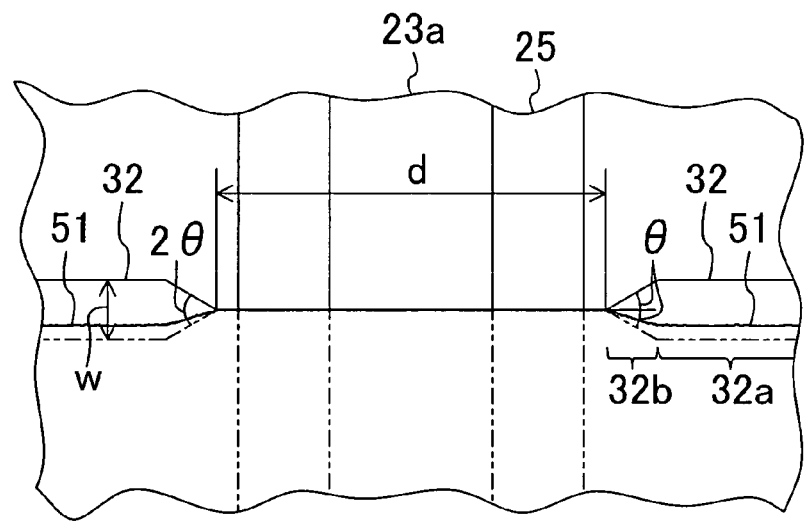
Figure 3B:
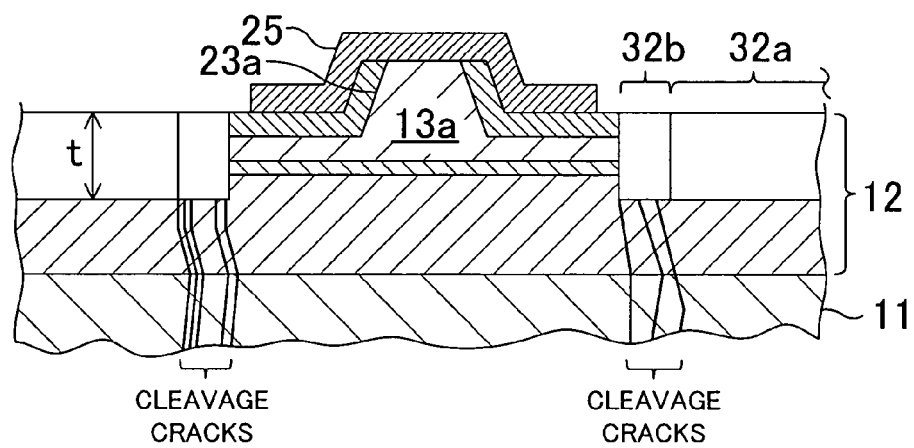

Hereinafter, the shape of the grooves 32 will be described in further detail. FIGS. 3A and 3B show the structure of a portion between the grooves 32 when the semiconductor wafer 10 is cleaved. FIG. 3A shows a planar structure, and FIG. 3B shows a cross-sectional structure. Each groove 32 is divided into halves by cleavage, forming notch portions 31. The state before the groove 32 is divided into halves will now be described.

In the case of a nitride semiconductor having a hexagonal crystal structure, it is difficult to accurately form a cleavage line along a cleavage guide even when a cleavage guide is formed by grooves arranged in a line and having a rectangular planar shape. In this embodiment, each groove 32 has a base portion 32a and end portions 32b located on both sides of the base portion 32a, and the base portion 32a is rectangular and each end portion 32b has a V-shape when viewed two dimensionally. In other words, each groove 32 has sharp ends along the direction crossing the ridge stripe portions 23a. Accordingly, even when a cleavage line 51 is displaced, the direction of the cleavage line is corrected along the wall surface of the end portion 32b, and cleavage is conducted from the tips of the groove 32 as shown in FIG. 3A. As a result, an accurate cleavage line can be formed in a region including the ridge strips portion 23a.

The direction of the cleavage line 51 is corrected by the wall surface of the end portion 32b due to cleavage cracks and steps that are produced in a region where the cleavage line 51 and the wall surface of the end portion 32b cross each other. Since fine cleavage cracks and the like are formed along the wall surface of the end portion 32b, the cleavage line 51 is guided in the direction along the wall surface of the end portion 32b. Accordingly, an angle at which the wall surface of the end portion 32b and the cleavage line 51, a cleavage facet, cross each other is very important.

Figure 4A:
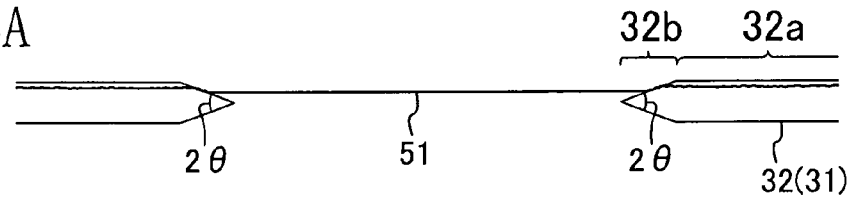
FIGS. 4A, 4B, and 4C are plan views showing a relation between an angle of an end portion of a groove and a cleavage line in the semiconductor laser device of the first embodiment of the invention.
Figure 4B:
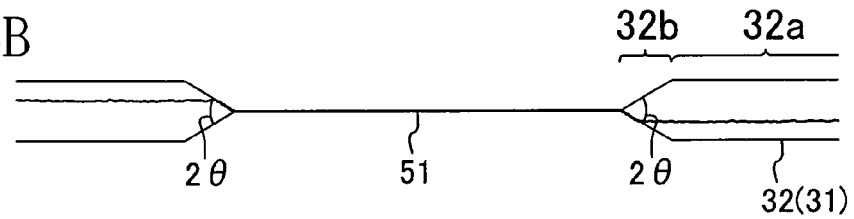
Figure 4C:
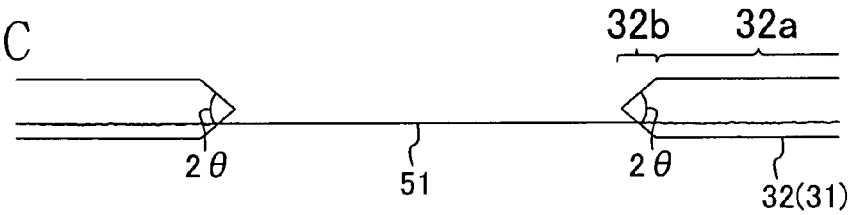

FIGS. 4A through 4C schematically show the cleavage results for various grooves 32 having different angles 2θ between the wall surfaces of the end portion. The grooves 32 are formed in the nitride semiconductor multi-layer 12 formed on the GaN substrate 11.

In FIG. 4B, the angle 2θ at the tip of each groove 32 is 60 degrees. In this case, even when the cleavage line 51 is displaced in the base portion 32a of the groove 32, the direction of the cleavage line 51 is corrected along the wall surface of the end portion 32b. As a result, the cleavage line 51 connecting the respective tips of the grooves 32 can be obtained. In FIGS. 4A and 4C, on the other hand, the angle 2θ at the tip of each groove 32 is 20 degrees or less, or 80 degrees or more. In this case, there is almost no effect of correcting the direction of the cleavage line 51 in the end portion 32b.

Figure 5:
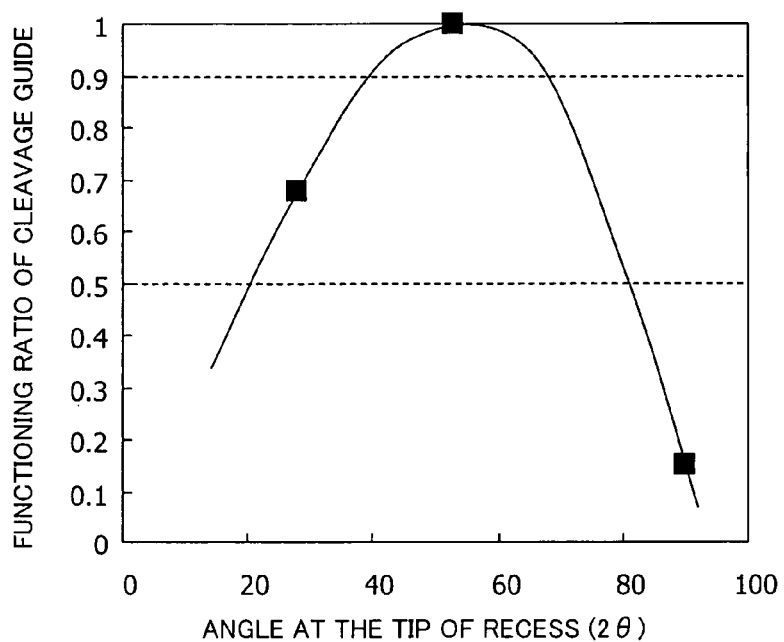
FIG. 5 is a graph showing a correlation between an angle of an end portion of a groove and a functioning ratio of a cleavage guide in the semiconductor laser device of the first embodiment of the invention.

FIG. 5 shows a correlation between the angle 2θ at the tip of each groove 32 and the functioning ratio of the cleavage guide. The functioning ratio of the cleavage guide herein indicates the ratio that the cleavage line connecting the respective tips of the grooves 32 was obtained. FIG. 5 shows a normalized functioning ratio, wherein the functioning ratio is 1 when the angle 2θ at the tip of the groove 32 is about 60 degrees. Whether the cleavage line connecting the respective tips of the grooves 32 was obtained or not was determined by microscopic observation. In this example, about 100 samples were observed. It should be noted that, in this observation, each groove 32 had a width w of 20 μm and a depth t of 2 μm, and a distance d between the tips of the grooves 32 was 50 μm. The width w, the depth t, and the distance d are as shown in FIGS. 3A and 3B.

As shown in FIG. 5, when the angle 2θ at the tip of the groove 32 is more than 80 degrees or less than 20 degrees, the normalized functioning ratio of the cleavage guide is 0.5 or less. This shows that the grooves 32 do not sufficiently function as a cleavage guide. This is a phenomenon specific to a nitride semiconductor having a hexagonal crystal structure. Since a nitride semiconductor has a hexagonal wurtzite structure, it has a facet equivalent to a face of <1-100> orientation, that is, a facet equivalent to a cleavage facet, at every 60 degrees. When the angle 2θ at the tip of each groove 32 is 60 degrees, the angle θ between the central axis of the groove 32 which is parallel to <11-20> orientation and each wall surface of the end portion 32b is 30 degrees. In this case, the wall surface of the end portion 32b extends in the direction farthest from the cleavage facet.

Accordingly, the angle 2θ at the tip of the groove 32 is preferably determined such that the wall surface of the end portion 32b extends in the direction as far away from the cleavage facet and a facet equivalent to the cleavage facet as possible. More specifically, the angle 2θ is in the range of 20 degrees and 80 degrees. Preferably, the angle 2θ is in the range of 40 degrees and 70 degrees in which the functioning ratio of the cleavage guide is 0.9 or more. More preferably, the angle 2θ is 60 degrees. The angle θ between the extending direction of the wall surface of the end portion 32b and the extending direction of the cleavage facet is half of the angle 2θ, that is, in the range of 10 degrees and 40 degrees.

The result of studying the width w of the groove 32 will now be described. When the cleavage line 51 is formed within the groove 32, the width w of the groove 32 hardly affects the function to correct displacement of the cleavage line. However, it was found that when the width w of the groove 32 is 10 μm or less, the cleavage line 51 may deviate from the groove 32 due to fine defects, foreign matter or the like. If the cleavage line 51 deviates to the outside of the groove 32, the cleavage line 51 cannot go back to the inside of the groove 32 and the groove 32 loses its function as a cleavage guide. As a result, most of the chips 41 formed in a line will have defective cleavage.

Figure 6:
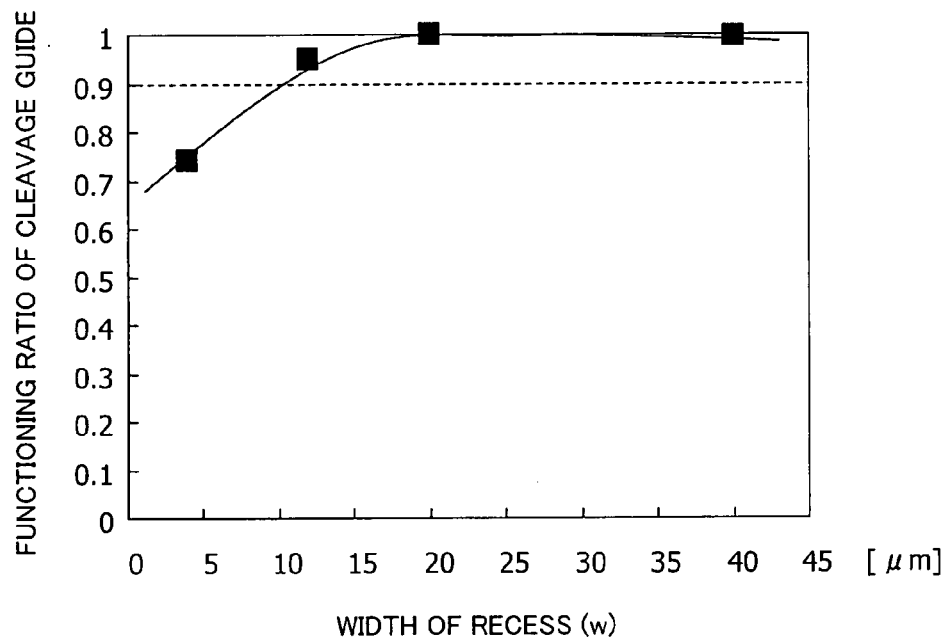
FIG. 6 is a graph showing a correlation between a width of a groove and a functioning ratio of a cleavage guide in the semiconductor laser device of the first embodiment of the invention.

FIG. 6 shows a correlation between the width w of the groove 32 and the functioning ratio of the cleavage guide. FIG. 6 shows a normalized functioning ratio, wherein the functioning ratio of a cleavage guide with the groove 32 having a width w of 20 μm is 1. In this example, the angle 2θ at the tip of the groove 32 is about 60 degrees, the depth t of the groove 32 is 2 μm, and the distance d between the respective tips of the grooves 32 is 50 μm.

FIG. 6 shows that the function of the cleavage guide degrades when the width w of the cleavage guide is 10 μm or less. This is because the cleavage line is likely to deviate to the outside of the groove 32 when the width w is 10 μm or less. On the other hand, when the width w of the groove 32 is too large, gold plating or the like for wiring cannot be formed in the groove 32. Therefore, heat dissipation property of the end facet portion degrades, causing degradation in element characteristics. Accordingly, it is practically desirable that the width w of the groove 32 be 50 μm or less.

The result of studying the effect of the distance d between the respective tips of the grooves 32 on the function as a cleavage guide groove will now be described. In this example, the grooves 32 were formed at various intervals in the nitride semiconductor multi-layer 12 formed on the GaN substrate 11, and cleavage was conducted. It was found that a cleavage line is likely to be displaced between the grooves 32 when the distance d between the tips of the grooves 32 is 100 μm or more.

Figure 7:
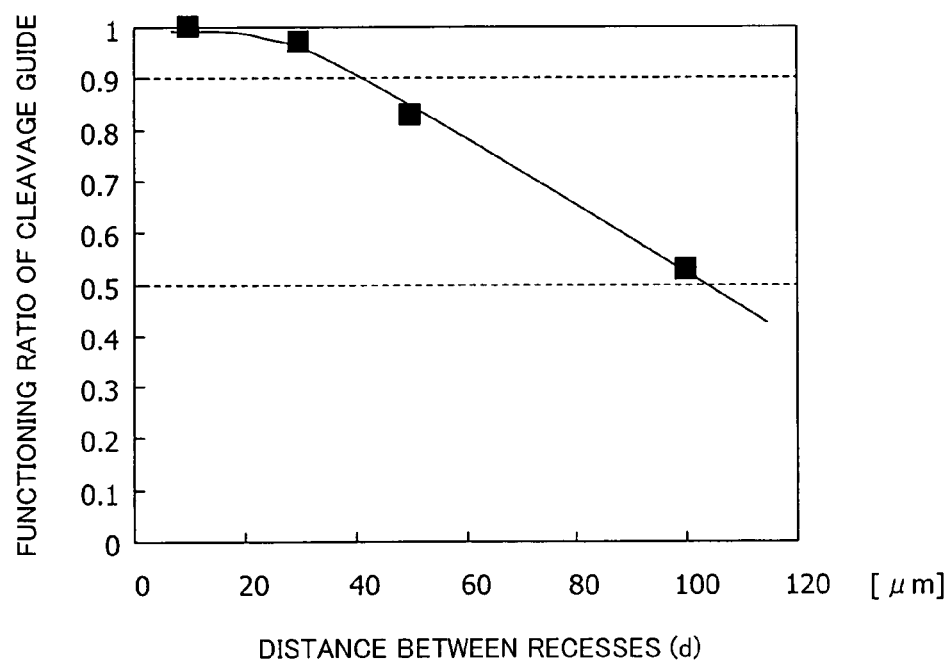
FIG. 7 is a graph showing a correlation between a depth of a groove and a functioning ratio of a cleavage guide in the semiconductor laser device of the first embodiment of the invention.

FIG. 7 shows a correlation between the distance d between the respective tips of the grooves 32 and the functioning ratio of the cleavage guide. FIG. 7 shows a normalized functioning ratio, wherein the functioning ratio of the cleavage guide is 1 when the distance d is 20 μm. As shown in FIG. 7, the functioning ratio of the cleavage guide reduces as the distance d increases. To be exact, the extending direction of the grooves 32 does not match the extending direction of a (1-100) crystal face, a cleavage facet, and there is a slight difference in angle between the extending direction of the grooves 32 and the extending direction of the (1-100) crystal face. Therefore, as the distance between the grooves 32 increases, cleavage cracks are more likely to be produced between the grooves, reducing the functioning ratio of the cleavage guide. Accordingly, the distance d between the grooves 32 should be 100 μm or less, and preferably, is 40 μm or less. When the distance d between the grooves 32 is too small, the tip of each groove 32 gets too close to a corresponding ridge stripe portion 23a, and cleavage cracks formed at the end portion of the groove 32 may affect laser characteristics. Accordingly, the distance d between the grooves 32 is preferably 20 μm or more.

The result of studying the depth t of the groove 32 will now be described. The function of the cleavage guide was examined for the grooves 32 having different depths t. When the depth t was less than 1 μm, the function of the cleavage guide degraded significantly. However, when the depth t was 1 μm or more, the groove 32 sufficiently functioned as a cleavage guide. Moreover, the larger the depth t of the groove 32 was, the more the function of the cleavage guide improved. However, when the groove 32 having a depth t of 10 μm or more is formed by dry etching, a mask material needs to be thick. This is because there is almost no mask material having a large selectivity to GaN. As the thickness of the mask material is increased, pattern resolution and accuracy are degraded, whereby the tips of the resultant grooves 32 get blunt. As a result, the cleavage position cannot be precisely controlled. Accordingly, the depth t of the groove 32 should be in the range of 1 μm and 10 μm, and preferably, in the range of 2 μm and 5 μm.

Figure 8:
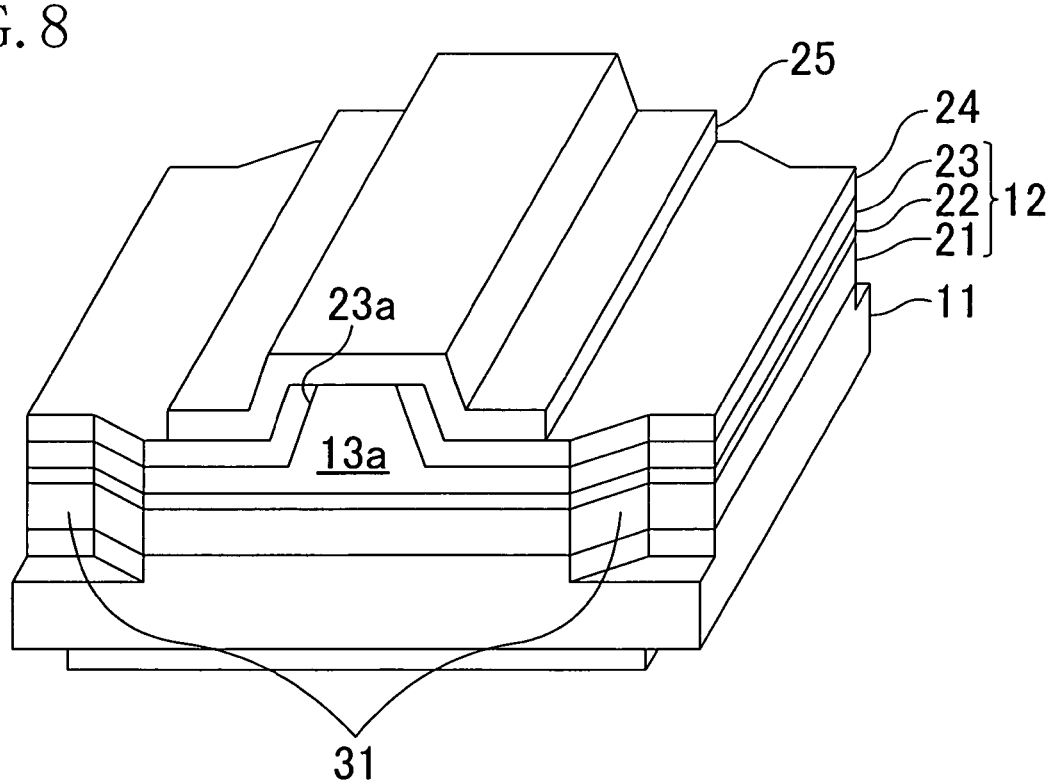
FIG. 8 is a perspective view showing a modification of the semiconductor laser device of the first embodiment of the invention.

The thickness of the nitride semiconductor multi-layer 12 of this embodiment is about 4 μm. The depth t of the groove 32 may be larger than the thickness of the nitride semiconductor multi-layer 12 and the structure as shown in FIG. 8 may be formed. Cleavage yield can be improved by this structure. The reason for this is considered as follows: the bottom of the end portion of the guide groove is subjected to the largest stress. Therefore, in this structure, the largest stress is applied not to the inside of the nitride semiconductor multi-layer 12 but to the inside of the substrate 11. Accordingly, excessive stress can be prevented from being applied to the nitride semiconductor multi-layer 12 upon cleavage.

Figure 9A:
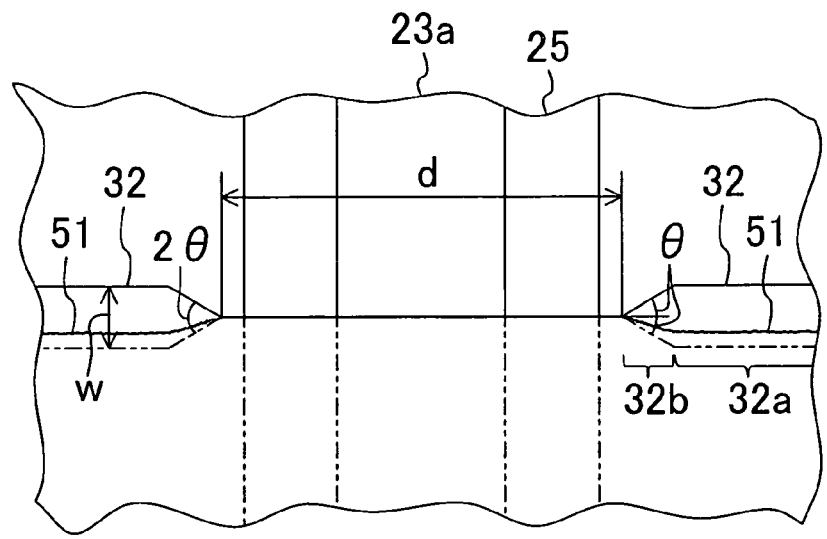
Figure 9B:
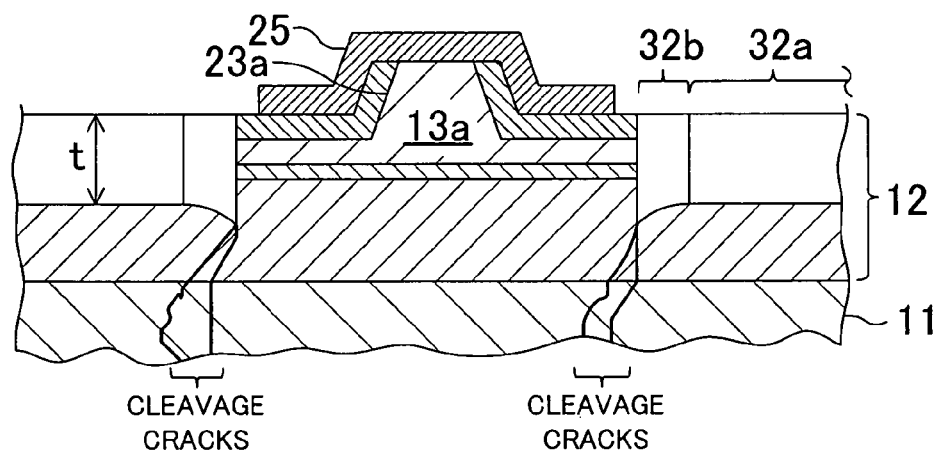

When dry etching is used to form the groove 32, the shape of the bottom of the groove 32 can be changed depending on conditions of dry etching such as power, pressure, and gas species. As shown in FIGS. 9A and 9B, when the groove 32 is deeper in the end portion 32b than in the base portion 32a, cleavage cracks and steps are generated intensively at the tip of the groove 32 upon cleavage. Therefore, an excellent cleavage facet 13a can be formed in a region including the ridge stripe portion 23a, whereby yield is improved. The reason for this is considered as follows: since the tip of the groove 32 has a sharp angle at the bottom, stress is applied intensively to the tip of the groove 32, whereby cleavage cracks and the like are likely to be generated. By thus controlling cleavage cracks and steps to be generated at a specific position, defective cleavage in the ridge stripe portion 23a, a stripe-shaped wave guide portion, is suppressed and yield can be improved.

Figure 10A:
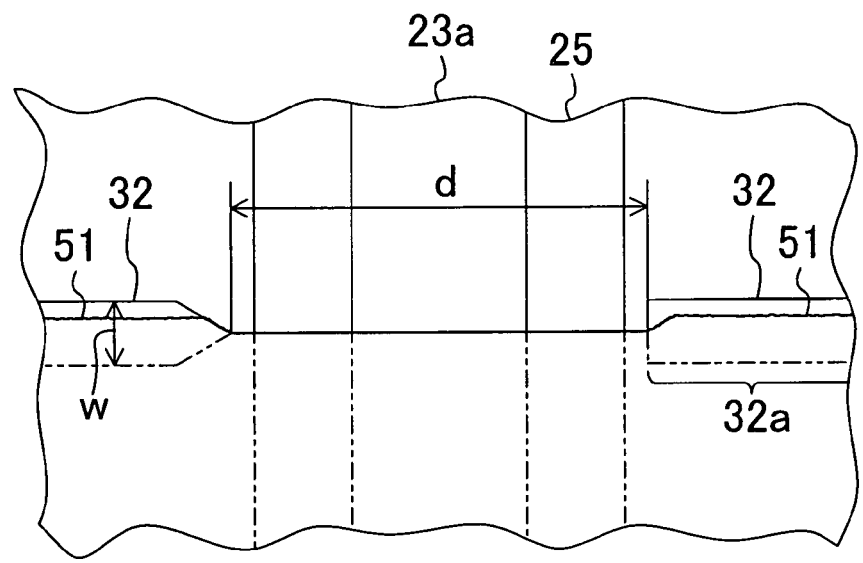
Figure 10B:
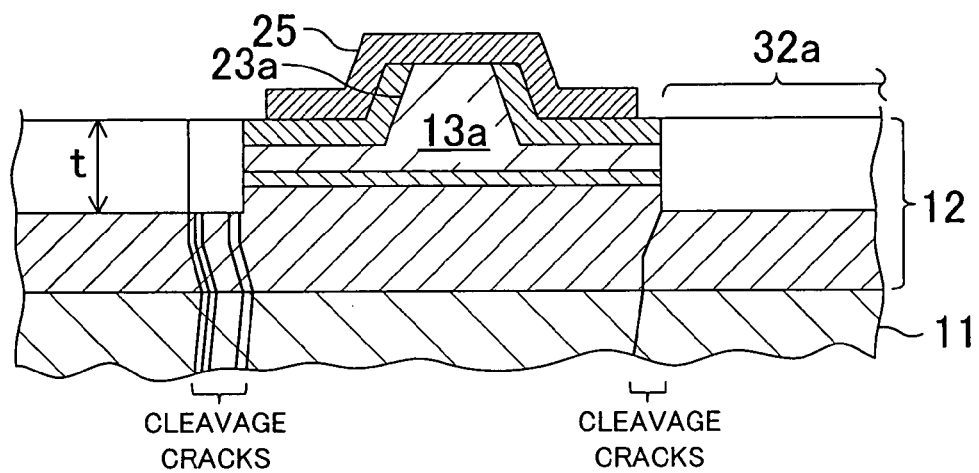

In this embodiment, the groove 32 has a base portion 32a and an end portion 32b on both sides of the base portion 32a. The base portion 32a has a rectangular shape and each end portion 32b has a V shape when viewed two dimensionally. As shown in FIGS. 10A and 10B, however, the groove 32 may alternatively have an end portion 32b at only one end of the base portion 32a. When each groove 32 has an end portion 32b on both sides of the base portion 32a and the grooves 32 are arranged so that the respective tips of adjacent two grooves 32 facet each other, a cleavage line connecting the two tips is likely to be formed. Therefore, the position of the cleavage line can be accurately controlled. However, when the tips facing each other are misaligned, the cleavage line does not match the crystal face, causing cracks to be generated. Therefore, by forming the grooves 32 having an end portion 32b only on one side of the base portion 32a and arranging the grooves 32 so that the tip of the groove 32 facets the base portion 32a of an adjacent groove 32, generation of cracks resulting from misalignment of the tips of the grooves 32 can be suppressed. Alternatively, a groove 32 having a base portion 32a and an end portion 32b on both sides of the base portion 32a and a groove 32 having only a base portion 32a may be arranged alternately.

Figure 11A:
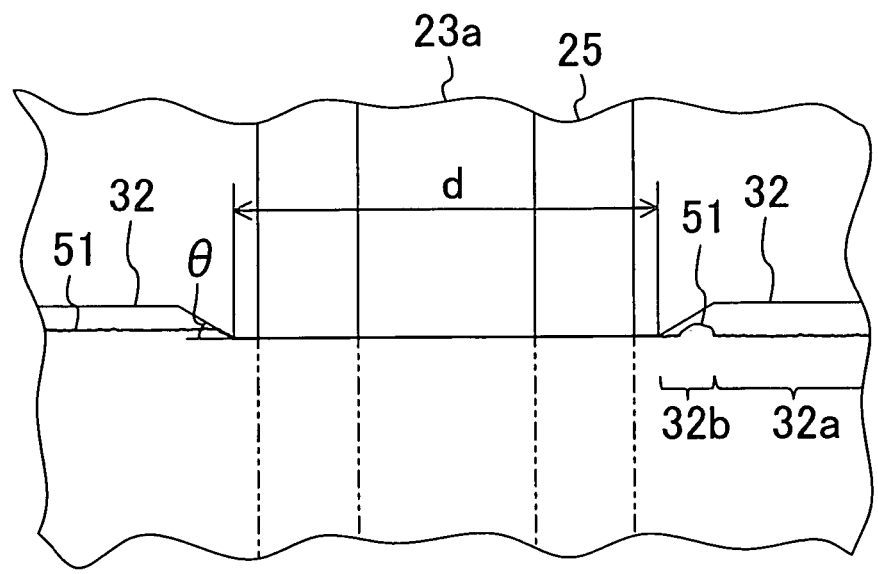
Figure 11B:
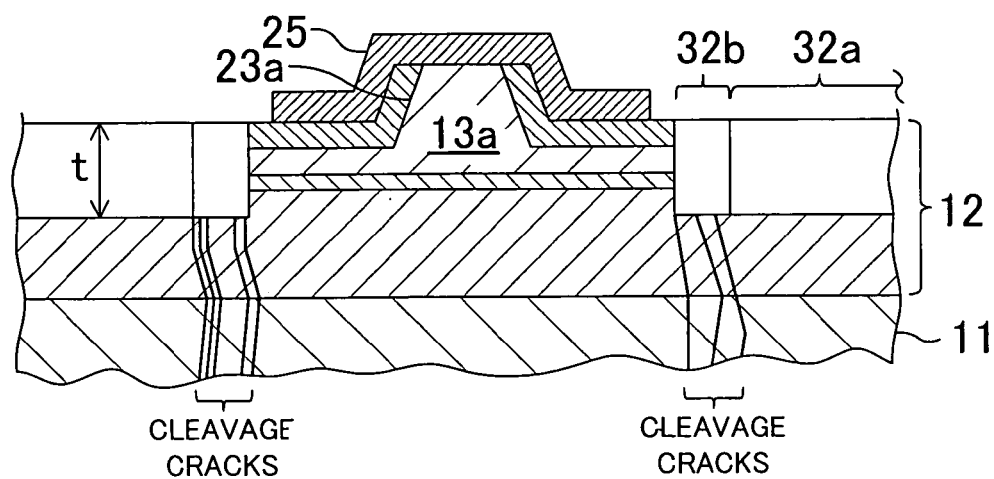

In this embodiment, the end portion 32b of the groove 32 has a V shape when viewed two dimensionally, and two sides of the end portion 32b have the same length. As shown in FIGS. 11A and 11B, however, the groove 32 may alternatively be shaped such that the end portion 32b is narrowed only from one side. In this case, the end portion 32b of each groove 32 has only one side that guides a cleavage line. Accordingly, the angle at the tip of the groove 32 is θ rather than 2θ.

Hereinafter, an example of a method for manufacturing a semiconductor laser device according to the first embodiment will be described. First, an n-GaN buffer layer (not shown) of 200 nm thickness is grown on an n-type GaN substrate 11 having a carrier concentration of about $10^{18}$ cm$^{-3}$ by a metal organic chemical vapor deposition (MOCVD) method. An n-type semiconductor layer 21, an active layer 22 having a triple quantum well structure, and a p-type semiconductor layer 23 are then successively formed. The n-type semiconductor layer 21 includes an n-GaN layer of 1 μm thickness, an n-$Al_{0.04}Ga_{0.96}N$ clad layer of 1.8 μm thickness, and an n-GaN optical guide layer of 150 nm thickness. The active layer 22 includes an $In_{0.10}Ga_{0.90}N$ well layer of 3 nm thickness and an $In_{0.02}Ga_{0.98}N$ barrier layer of 7.5 nm thickness. The p-type semiconductor layer 23 includes a p-GaN optical guide layer of 120 μm thickness, a p-$Al_{0.05}Ga_{0.95}N$ clad layer of 0.5 μm thickness, and a p-GaN contact layer of 100 nm thickness. The n-type semiconductor layer 21 is doped with silicon (Si) at about $5\times10^{17}$ cm$^{-3}$ as donor impurities, and the p-type semiconductor layer 23 is doped with magnesium (Mg) at about $1\times10^{19}$ cm$^{-3}$ as acceptor impurities. The p-contact layer, the uppermost layer of the p-type semiconductor layer 23, is highly doped with Mg at about $1\times10^{20}$ cm$^{-3}$. It should be noted that the semiconductor multi-layer structure of this embodiment is by way of example only, and the semiconductor lamination structure and the growth method are not limited to those described above.

Thereafter, a silicon oxide ($SiO_2$) film of 20 nm thickness is deposited on the p-type contact layer by an CVD (chemical vapor deposition) method. Heat treatment of 800° C. is conducted in an $N_2$ atmosphere for 30 minutes to activate Mg in the p-type semiconductor layer 23. A stripe-shaped $SiO_2$ mask is then formed by photolithography and dry etching using reactive ion etching (RIE). By using the $SiO_2$ mask, dry etching is conducted using inductively coupled plasma (ICP) with $Cl_2$ gas, whereby the p-type semiconductor layer 23 is etched to about 0.5 μm thickness and a ridge stripe portion 23a is formed. Heat treatment of 800° C. is then conducted in an $N_2$ atmosphere for 30 minutes in order to recover damages caused by the ICP dry etching. The $SiO_2$ film used as a mask is removed by buffer hydrofluoric acid (BHF), and a $SiO_2$ film of 200 nm thickness is then deposited as a $SiO_2$ dielectric layer 24.

An opening that exposes only the top of the ridge stripe portion 23a is formed in the $SiO_2$ dielectric layer 24 by photolithography and wet etching using a buffered hydrofluoric acid (BHF) solution. A p-side electrode 25 is then formed by photolithography and electron-beam deposition. The p-side electrode 25 is formed from palladium (Pd) and platinum (Pt). The thicknesses of Pd and Pt are 40 nm and 35 nm, respectively, and the deposition is conducted with the substrate heated at 70° C. Thereafter, heat treatment of 400° C. is conducted, whereby excellent contact resistance of $5\times10^{-4}$ Ωcm$^2$ or less is obtained. Our study shows that the best contact resistance is obtained when the deposition is conducted at about 70° C. to about 100° C. Given the heat resistance of a resist used for patterning, deposition at 70° C. is an optimal condition that does not reduce the process yield and that improves the contact resistance.

By photolithography and ICP dry etching, grooves 32 are formed on each line forming a chip end facet, whereby cleavage guide grooves 33 are formed like a dashed line as shown in FIGS. 2A through 2C. Note that, as shown in FIGS. 3A and 3B, the grooves 32 are not formed in the ridge stripe portions 23a. After gold electrode pad for wiring is formed on the p-side electrode 25, the rear surface of the substrate 11 is ground and polished so that the substrate 11 has a thickness of about 100 μm. An n-side electrode 26 is then formed on the rear surface of the substrate 11. The n-side electrode 26 is formed from titanium (Ti), platinum (Pt), and gold (Au), and the thicknesses of Ti, Pt, and Au are 5 nm, 100 nm, and 500 nm, respectively. Excellent contact resistance on the order of $10^{-4}$ Ωcm$^{-2}$ or less can thus be implemented.

Finally, cleavage is conducted by breaking the substrate 11 from the rear surface along the cleavage guide grooves 33, whereby chip end facets are formed. Moreover, chips are cut out in parallel with the ridge stripe portion 23a by dicing. Semiconductor laser devices are thus obtained.

Second Embodiment

Figure 12:
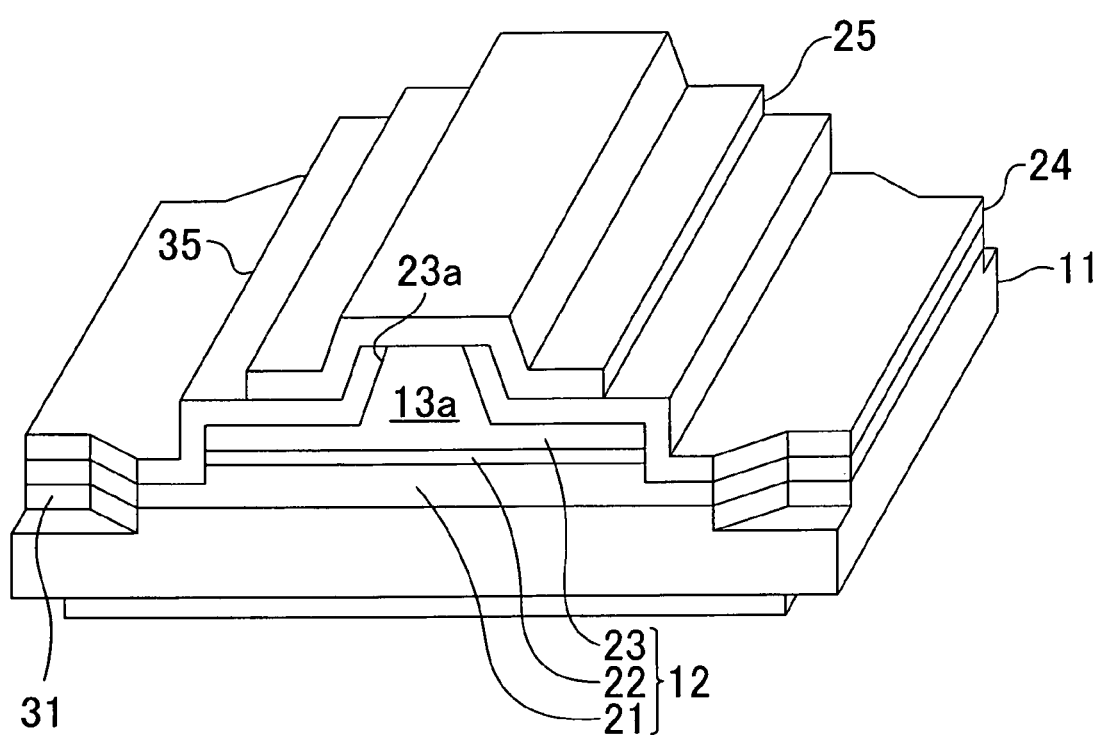
FIG. 12 is a perspective view of a semiconductor laser device according to a second embodiment of the invention.

Hereinafter, a second embodiment of the invention will be described with reference to the drawings. FIG. 12 shows a semiconductor laser device according to a second embodiment of the invention. In FIG. 12, the same elements as those of FIGS. 1A through 1C are denoted with the same reference numerals and characters, and description thereof will be omitted.

As shown in FIG. 12, in the semiconductor laser device of this embodiment, a p-type semiconductor layer 23, an active layer 22, and a part of an n-type semiconductor layer 21 are etched on both sides of a ridge stripe portion 23a so that a mesa-shaped stepped portion 35 is formed for element isolation.

In this embodiment, the mesa-shaped stepped portion 35 is formed between each groove 32 and the ridge stripe portion 23a in the direction parallel to the extending direction of the ridge stripe portion 23a. Forming such a stepped portion 35 can suppress generation of cleavage cracks and the like in a cleavage facet 13a.

Figure 13A:
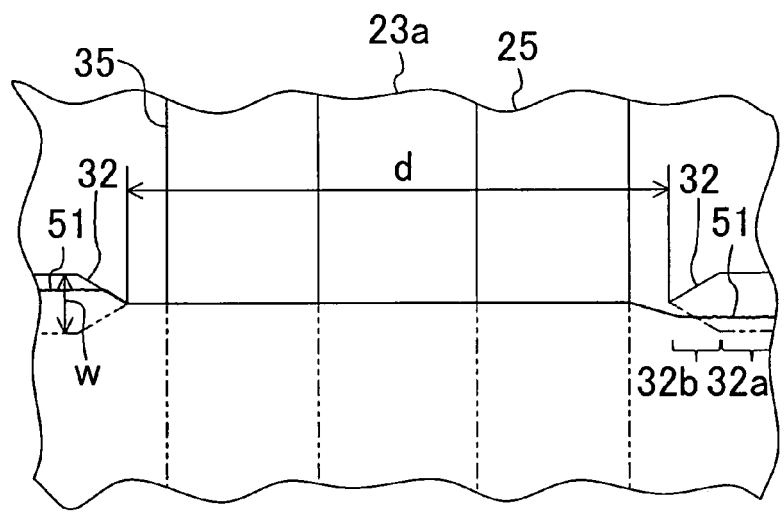
Figure 13B:
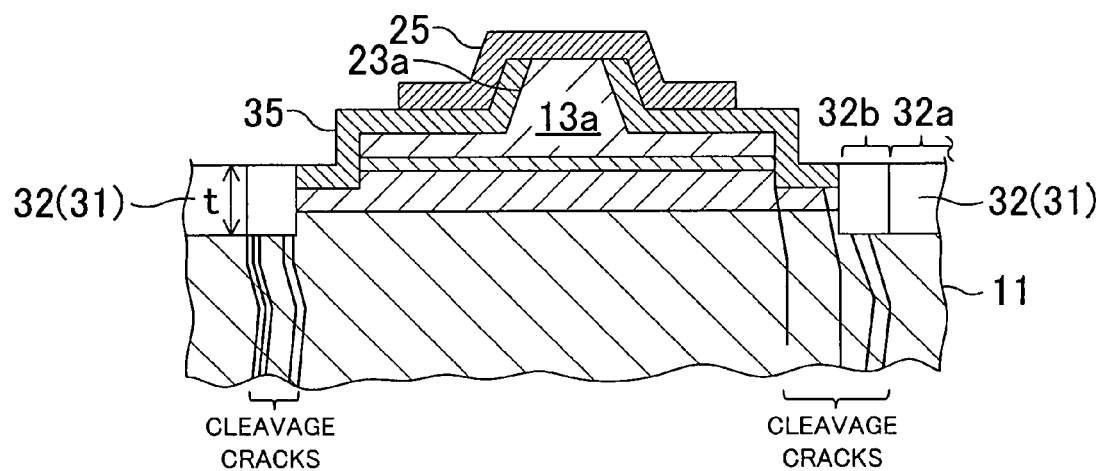

Hereinafter, the reason why forming the stepped portion 35 can suppress generation of cleavage cracks will be described. FIGS. 13A and 13B show the structure of a portion between grooves 32 of the semiconductor laser device of this embodiment. FIG. 13A shows a planar structure, and FIG. 13B shows a cross-sectional structure.

As shown in FIGS. 13A and 13B, when a semiconductor wafer 10 is cleaved, cleavage cracks, steps, and the like are generated intensively at the end portion 32b of each groove 32. In this embodiment, cleavage cracks are also generated intensively at the stepped portion 35 formed between the groove 32 and the ridge stripe portion 23a. As a result, an accurate cleavage line is obtained in the region between the stepped portions 35, 35, and generation of cleavage cracks can be suppressed in the region including the ridge stripe portion 23a.

Figure 14A:
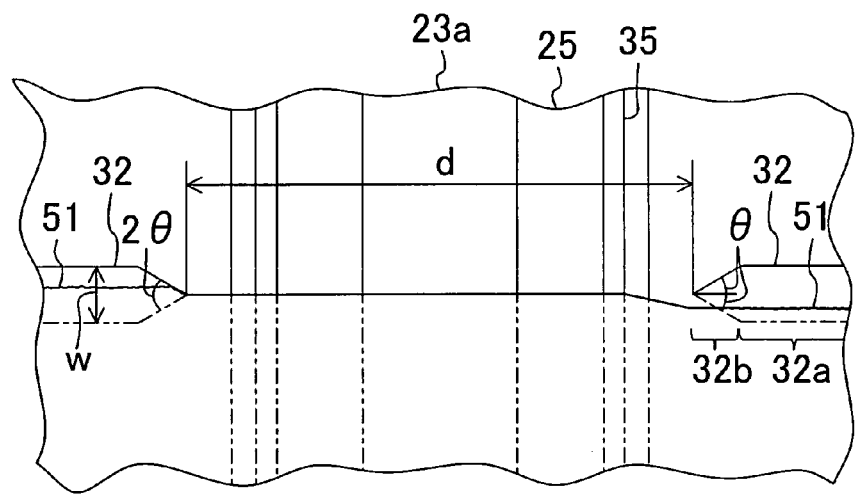
Figure 14B:
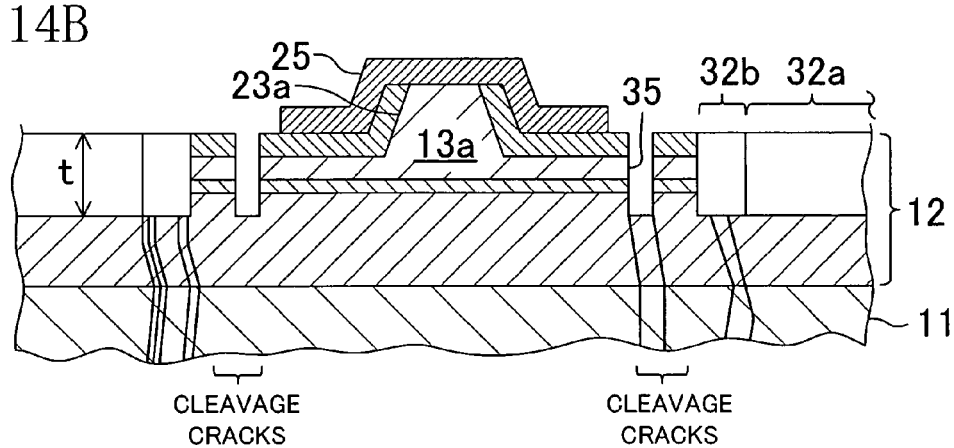

In this embodiment, the stepped portion 35 is a mesa-shaped stepped portion extending in the direction parallel to the extending direction of the ridge stripe portion 23a. However, the stepped portion 35 need only be formed as a step of several micrometers between the groove 32 and the ridge stripe portion 23a. As shown in FIGS. 14A and 14B, the stepped portion 35 may be formed by forming between the groove 32 and the ridge stripe portion 23a a groove extending in the direction parallel to the extending direction of the ridge stripe portion 23a. In this case, the grooves 32 and the stepped portions 35 can be formed simultaneously by etching. Therefore, the number of processes is not increased, which is economically advantageous. The stepped portion 35 may have another structure as long as a step of several micrometers can be formed between the groove 32 and the ridge stripe portion 23a in the direction parallel to the extending direction of the ridge stripe portion 23a.

Third Embodiment

Figure 15A:
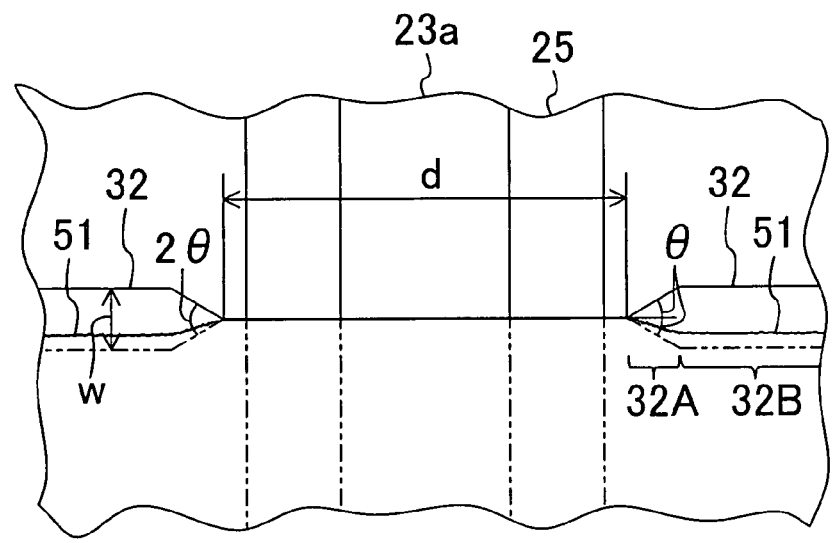
Figure 15B:
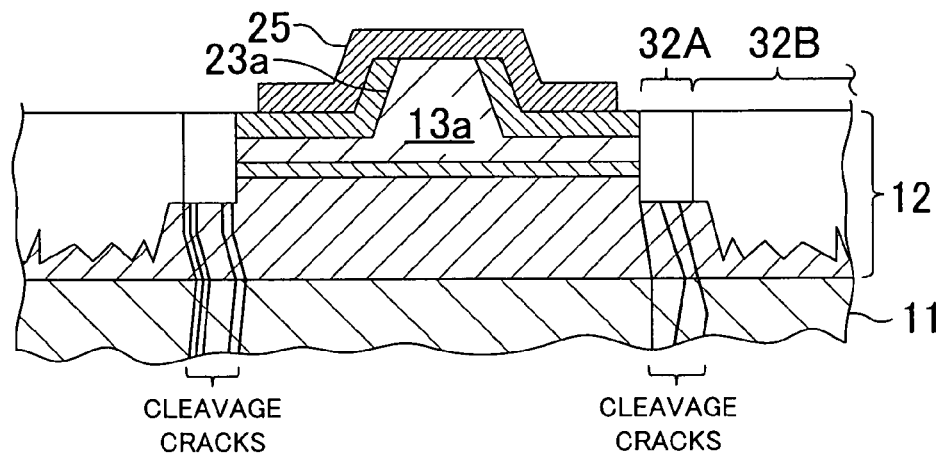

Hereinafter, a third embodiment of the invention will be described with reference to the drawings. FIGS. 15A and 15B show a structure of a portion between grooves 32 of a semiconductor laser device of the third embodiment. FIG. 15A shows a planar structure and FIG. 15B shows a cross-sectional structure. In FIGS. 15A and 15B, the same elements as those of FIGS. 3A and 3B are denoted with the same reference numerals and characters, and description thereof will be omitted.

As shown in FIGS. 15A and 15B, each groove 32 of the semiconductor laser device of this embodiment is formed by a shallow groove 32A and a deep groove 32B. The shallow groove 32A is formed by dry etching, and the deep groove 32B is formed by scribing a central part of the shallow groove 32A.

When a groove is formed by scribing, the depth of the groove can be easily increased. With scribing, however, grooves cannot be formed with a uniform shape. Therefore, cleavage cracks and the like are likely to be produced, and a cleavage line cannot be accurately controlled. On the other hand, when a groove is formed by etching, it is difficult to form a deep groove. However, when the groove is too shallow, it is difficult to form an accurate cleavage line between the ends of the grooves. Moreover, the cleavage line may be displaced from the grooves, whereby the grooves may lose their function as a cleavage guide groove.

Since accuracy of the cleavage line is not required in the central part of the groove 32, the central part of the groove 32 is formed as a deep groove 32B formed by scribing. Since the end of the groove 32 needs to have an accurate shape, the end of the groove 32 is formed as a shallow groove 32A formed by etching. In this way, even when the groove 32A is shallow, an accurate cleavage line can be realized in the portion between the grooves 32.

The deep groove 32B can be formed by first forming the shallow groove 32A by dry etching and then scribing the central part of the shallow groove 32A with a diamond needle. Laser beams, electron beams, or the like may be used instead of a diamond needle. By using an appropriate spot size and power of laser beams, electron beams, or the like, deep guide grooves can be formed as in the case of scribing with a diamond needle. Scribing with laser beams or electron beams can improve the scan speed as compared to scribing with a diamond needle. Therefore, processing time can be significantly reduced.

Fourth Embodiment

Figure 16A:
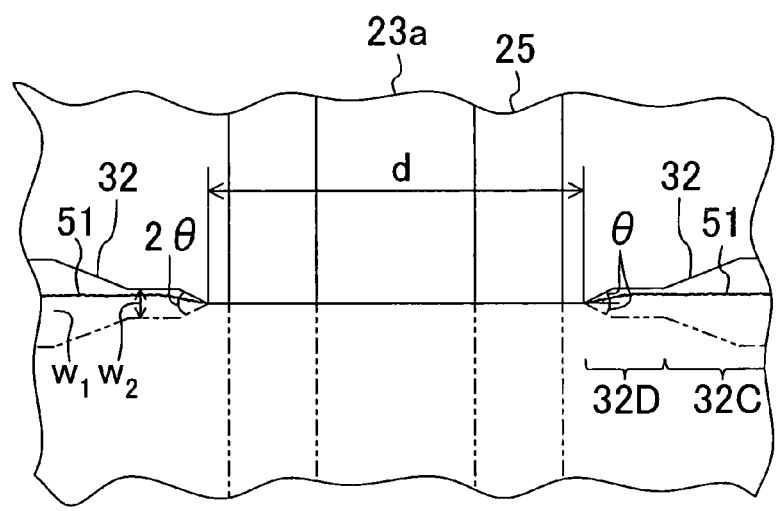
Figure 16B:
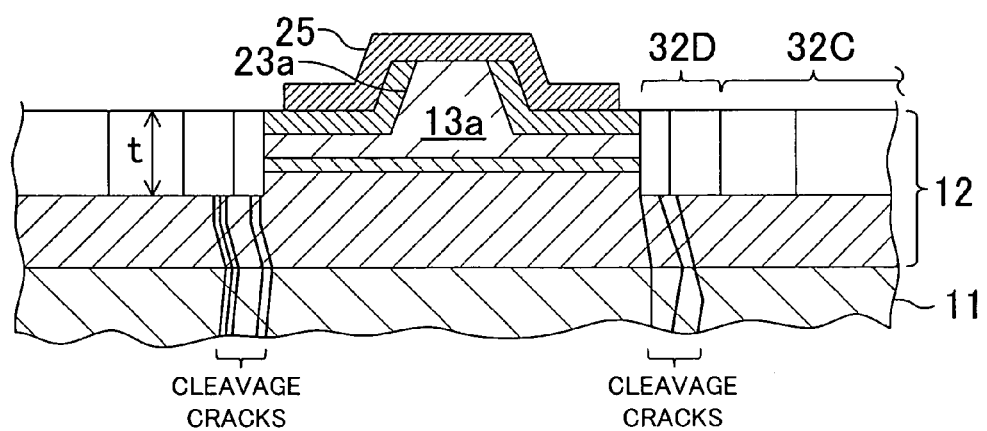

Hereinafter, a fourth embodiment of the invention will be described with reference to the drawings. FIGS. 16A and 16B show a structure of a portion between grooves 32 of a semiconductor laser device according to the fourth embodiment. FIG. 16A shows a planar structure, and FIG. 16B shows a cross-sectional structure. In FIGS. 16A and 16B, the same elements as those in FIGS. 3A and 3B are denoted with the same reference numerals and characters, and description thereof will be omitted.

As shown in FIGS. 16A and 16B, each groove 32 of the semiconductor laser device of this embodiment has a width that varies in two stages. More specifically, each groove 32 is formed by a first region 32C having a larger width and a second region 32D formed on both sides of the first region 32C and having a smaller width than that of the first region 32C.

As described before, the functioning ratio of a cleavage guide decreases as the width of the groove 32 decreases. However, this happens for the following reason: with a small width w, a cleavage line 51 cannot be returned to the inside of the groove 32 once the cleavage line 51 is displaced. As a result, almost all of resonators arranged in a line have defective cleavage. When only the examples in which the cleavage line 51 could be kept within the groove 32 are compared, it is found that higher accuracy of the cleavage line 51 can be obtained from a groove 32 having a smaller width. In this embodiment, therefore, each groove 32 is formed from a first region having a large width w and a second region having a small width w, whereby accuracy of the cleavage line 51 between the respective end portions of the grooves 32 is improved. Moreover, even when the cleavage line 51 is displaced, the cleavage line 51 can be returned to the inside of the groove 32. The first region 32C has a width $w_1$ in the range of 20 μm to 50 μm, and the second region 32D has a width $w_2$ in the range of 2 μm and 10 μm.

As shown in FIGS. 16A and 16B, it is preferable that each groove 32 have a portion with a gradually reduced width w between the first region 32C and the second region 32D. In this case, the planar shape of each groove 32 has the first region 32C as a protruding portion having a planar isosceles trapezoid shape and protruding in both directions parallel to the extending direction of the ridge stripe portion 23a. Like the angle θ of the tip of the groove 32, an inclination angle of a portion of the first region 32C which has a gradually reduced width w, that is, an inclination angle of a portion corresponding to the oblique side of the isosceles trapezoid, is preferably in the range of 10 degrees and 40 degrees. This increases probability that the direction of the cleavage line 51 displaced within the groove 32 is corrected and guided to the tip of the groove 32. It should be noted that the inclination angle does not need to be the same as the angle θ at the end portion of the groove 32.

A ridge-type semiconductor laser device is described in the first through third embodiments. However, the invention can be applied to an electrode stripe type semiconductor laser device, a buried stripe type semiconductor laser device, and the like. In the above embodiments, the grooves 32 are formed from the side of the nitride semiconductor multi-layer 12. However, the same effects can be obtained even when the grooves 32 are formed from the side of the substrate 11.

As has been described above, the semiconductor laser device and the manufacturing method thereof according to the invention can implement a semiconductor laser device formed from a semiconductor material of a hexagonal system such as a nitride semiconductor and having a structurally stable cleavage facet. The semiconductor laser device and the manufacturing method thereof according to the invention are especially useful as a semiconductor laser having a resonator end facet formed by cleavage and a manufacturing method thereof.

What is claimed is:

1. A semiconductor laser device, comprising:
a chip obtained from a substrate and a semiconductor multi-layer formed on the substrate, the semiconductor multi-layer being formed from a plurality of semiconductor layers of a semiconductor material having a hexagonal structure, and including a stripe-shaped wave guide portion, wherein
the chip includes two chip end facets that extend in a direction crossing an extending direction of the wave guide portion, and two chip side facets that extend in parallel with the extending direction of the wave guide portion,
a region including the wave guide portion in each chip end facet is a cleavage facet resulting from cleavage of the semiconductor multi-layer,
each of regions on both sides of the wave guide portion in at least one of the chip end facets has a notch portion formed by notching a part of the chip, the notch portion exposing a first wall surface connecting to the chip end facet and a second wall surface connecting to the chip side facet, and
an angle between an extending direction of the first wall surface in at least one of the two notch portions and an extending direction of the cleavage facet is in a range of about 10 degrees to about 40 degrees.

2. The semiconductor laser device according to claim 1, wherein a stepped portion that extends in parallel with the extending direction of the wave guide portion is formed in a region between the wave guide portion and the notch portion in the chip so as to be spaced apart from the wave guide portion and the notch.

3. The semiconductor laser device according to claim 1, wherein a distance from the second wall surface of each notch portion to an extended position of the cleavage facet is in a range of about 5 µm to about 25 µm.

4. The semiconductor laser device according to claim 1, wherein each notch portion has a first portion formed on a side of the wave guide portion and a second portion formed on a side of the chip side facet,
the first wall surface and a third wall surface that connects to the first wall surface and extends in parallel with the second wall surface are exposed in the first portion,
the second wall surface and a fourth wall surface that connects to the second wall surface and the third wall surface are exposed in the second portion,
a distance from the third wall surface to an extended position of the cleavage facet is in a range of about 1 µm to about 5 µm,
a distance from the second wall surface to the extended position of the cleavage facet is in a range of about 10 µm to about 25 µm, and
an angle between an extending direction of the fourth wall surface and the extending direction of the cleavage facet is in a range of about 10 degrees to about 40 degrees.

5. The semiconductor laser device according to claim 1, wherein each notch portion has a depth of about 1 µm to about 10 µm.

6. The semiconductor laser device according to claim 1, wherein each notch portion is deeper in its end part facing the wave guide portion than in its remaining part.

7. The semiconductor laser device according to claim 1, wherein a part of each notch portion which facets the wave guide portion is a shallow notch portion formed by etching, and a remaining part of each notch portion is a deep notch portion formed by scribing, and the shallow notch portion has a depth of about 2 µm or less.

8. The semiconductor laser device according to claim 1, wherein a distance between two notch portions formed on both sides of the cleavage facet is in a range of about 30 µm to about 100 µm.

9. The semiconductor laser device according to claim 1, wherein each notch portion is formed from a side of the semiconductor multi-layer of the chip.

10. The semiconductor laser device according to claim 1, wherein each notch portion is formed from a side of the substrate of the chip.

11. The semiconductor laser device according to claim 1, wherein an angle between an extending direction of the first wall surface of one of the two notch portions and an extending direction of the cleavage facet is in a range of about 10 degrees to about 40 degrees, and
an angle between an extending direction of the first wall surface of another one of the two notch portions and the extending direction of the cleavage facet is about 90 degrees.

* * * * *